United States Patent [19]

Annis

[11] Patent Number: 4,474,685

[45] Date of Patent: Oct. 2, 1984

[54] HIGH PERFORMANCE MOLDING COMPOUNDS FOR SHIELDING ELECTROMAGNETIC INTERFERENCE

[75] Inventor: Myron C. Annis, North Tonawanda, N.Y.

[73] Assignee: Occidental Chemical Corporation, Niagara Falls, N.Y.

[21] Appl. No.: 363,322

[22] Filed: Mar. 29, 1982

[51] Int. Cl.$^3$ .............................................. H01B 1/02
[52] U.S. Cl. ..................................... 252/503; 252/506; 252/511; 524/439; 524/440; 524/441; 524/495; 523/137; 523/451; 523/457; 523/458; 523/459; 523/468; 523/440; 523/512; 523/513; 264/104; 264/105
[58] Field of Search ............... 252/502, 503, 506, 511; 524/439, 440, 441, 495, 496, 414; 264/104, 105; 523/137, 451, 457, 458, 459, 468, 440, 512, 513

[56] References Cited

U.S. PATENT DOCUMENTS

| | | | |
|---|---|---|---|
| 3,563,933 | 2/1971 | Stover | 524/495 |
| 4,115,508 | 9/1978 | Hughes | 524/496 |
| 4,197,218 | 4/1980 | McKaveney | 252/503 |
| 4,281,284 | 7/1981 | Stutz et al. | 324/58 A |

OTHER PUBLICATIONS

"Conductive Composites for EMI Shielding", Battelle Columbus Laboratories, 6-14-78.

Primary Examiner—Josephine L. Barr
Attorney, Agent, or Firm—James F. Tao; James F. Mudd

[57] ABSTRACT

High shielding efficiencies to emissions of electromagnetic interference are achieved with molding compositions comprised of thermosetting resins and a multicomponent electroconductive filler system. Compounds having a combination of at least two conductive fillers provide shielding efficiencies of 30 dB of attenuation or more to electromagnetic emissions over a frequency range of 0.5 to 1000 Mhz without adversely affecting mechanical properties and processing capabilities.

23 Claims, 3 Drawing Figures

HIGH PERFORMANCE MOLDING COMPOUNDS FOR SHIELDING ELECTROMAGNETIC INTERFERENCE

BACKGROUND OF THE INVENTION

The present invention relates generally to electroconductive molding compositions which are especially useful in fabricating shielding for sophisticated electronic equipment, power tools, automotive ignition systems, household appliances like microwave ovens, or for that matter, any component(s) or equipment which produces stray electromagnetic emissions and have the potential of damaging or adversely affecting the performance of other equipment or components. More particularly, the immediate invention relates to electrically conductive bulk, granular or nodular molding compounds comprising a multi-component filler system having at least two members from the group consisting of particulate carbon black, graphite and metal particles, the combination providing a spectrum of shielding to electromagnetic interference (EMI) which said individual fillers are unable to achieve without substantial reduction in mechanical properties and/or processing characteristics.

Heretofore, various methods have been used to shield electronic equipment. Metallic boxes and cans fabricated from steel, copper, aluminum, etc., were used by surrounding high EMI emitters for shielding. However, because shields fabricated from metal were cumbersome, heavy and costly the electronics industry has resorted to metallized plating on plastics. But, the results obtained with metallic coatings were not always satisfactory. In addition to being relatively non-economic, once such metallic coatings were scratched through they would lose part of their shielding efficiency. Unless such conductive coatings are continuous and free of voids, electromagnetic waves will be free to pass through. Frequently, it was difficult to obtain a dependable, 100% effective coating which was also resistant to peeling.

Further efforts by the electronics industry to develop more dependable light-weight materials for EMI shielding has led to a third approach, namely electrically conductive composites consisting of a variety of polymers loaded with conductive fillers and/or reinforcements. It was anticipated that intricate shapes could be molded from the composite materials by conventional means, yielding a finished part that promised to be more economic and dependable than metal or metal-coated plastics.

One of the most common conductive fillers used in the composite approach has been carbon black. The major advantage of resinous composites containing this filler has been that it flows readily in molding processes, and therefore, provides a high degree of design flexibility. However, in order to obtain nominally acceptable shielding efficiencies to EMI emissions loadings of carbon black in molding compounds should be above 15% by weight. A similar requirement also exists in the case of graphite powder. In each instance, the loading levels required of powdered and spherical-shaped conductive fillers has been too high to achieve acceptable conductivity without reducing the impact resistance and other mechanical properties needed for EMI shields and housings. Carbon/graphite fibers also provide acceptable EMI shielding efficiencies, but because of very high cost they are not viewed as acceptable alternatives to the more economic powders and nodules.

Metal particles of various sizes and shapes such as aluminum, copper, nickel, zinc, etc., have also been used in molding compositions as conductive fillers. The principle factor influencing the performance of metal-filled composites is the aspect ratio of the particles. For example, spherical-shaped particles must be loaded to a 38% by volume concentration to achieve electrical conductivity. However, this frequently leads to poor mechanical properties and poor cost effectiveness. In contrast, fibrous metal particles are able to impart electrical conductivity to composites with as little as 7% by-volume metal. However, high aspect ratio fibers are difficult to process in that they become entangled and agglomerate producing a poorly dispersed mixture.

A search of the literature, including patent publications relating to electrically conductive composites, uncovered the following: U.S. Pat. Nos. 1,556,990; 4,124,747 and 4,197,218. U.S. Pat. No. 1,556,990 relates to electrical brushes and contacts for machinery comprised of graphite, pulverized metals, carbon, coke or lamp black in a thermosetting phenolic resin binder. The compositions have a loading from 75-99% filler and up to 25% resin binder. Compositions with such high ratios of filler to binder will have downgraded mechanical properties. Carbon black is blended with thermoplastic polymer in U.S. Pat. No. 4,124,747. At low carbon black loadings the conductive behavior is very erratic and difficult to predict whereas at high filler loadings a penalty is incurred in physical properties. U.S. Pat. No. 4,197,218 discloses conductive compositions comprising a non-conductive plastic material and a ferroalloy. Ferrophosphorous, for example, is a material having a high bulk density, and suggested loadings of up to 90% by weight are excessive for satisfactory molding compounds used in fabricating light-weight shielding devices. By comparison, lower more tolerable levels of such ferroalloys in bulk molding compounds provide shielding coefficients to EMI emissions which are considered too low.

In the technical literature, D. M. Bigg et al. reported in *Industrial Research/Development*, pp. 103–105, July 1979, the use of aluminum flake and fiber in molded composites wherein at page 104 a polyester composite filled with 20% aluminum fiber provided about 40 dB of attenuation up to a frequency of only 30 Mhz but dropped below 30 dB at 100 Mhz. Polyester composites filled with 30% aluminum flake provided 30 dB of attenuation up to 100 Mhz but dropped below 20 dB at about 500 Mhz; indicating the inability of particulate aluminum-filled composites of maintaining sufficiently high shielding efficiencies over the entire spectrum of frequencies ranging from 0.5 to 1000 Mhz.

*Plastics Compounding*, page 19 etc., January/February 1980, describes the use of various conductive fillers including carbon black, metallized glass fibers, carbon/graphite fibers and aluminum fibers, flakes and ribbon. *Plastics Design Form*, page 16 etc., March/April 1979, also discloses the use of conductive fillers in plastic housings for EMI shielding. However, both authors fail to disclose how one may achieve shielding efficiencies which are constantly high (at least 30-40 dB) and substantially linear over the spectrum of electromagnetic frequencies (0.5 to 1000 Mhz). *Iron Age*, pp. 59–61, Oct. 1, 1979, suggests aluminum fibers over flakes dispersed evenly throughout molded thermoplastic resins with loading levels of 20-30% by weight. Combinations of conductive fillers to achieve a specific level of range and shielding are not suggested. Accordingly, there is a need for more dependable, high performance molding compounds which will provide consistently high shielding efficiencies to electromagnetic emissions without forfeiting mechanical and/or processing capabilities.

It has now been discovered that molding compositions comprising a multi-component conductive filler system is capable of providing unexpected advantages in EMI shielding. The multi-component system is able to provide at least 20 dB, and more preferably, 30–70 dB attenuation of constant shielding effectiveness over the entire frequency spectrum of 0.5 to 1000 Mhz as demonstrated by substantially linear shielding efficiency/frequency curves (FIGS. 1 and 2). The improved shielding performance is accomplished without adversely affecting the processing capabilities of the molding compound or the mechanical properties of the molded composites.

DETAILED DESCRIPTION OF THE INVENTION

Figure 1:
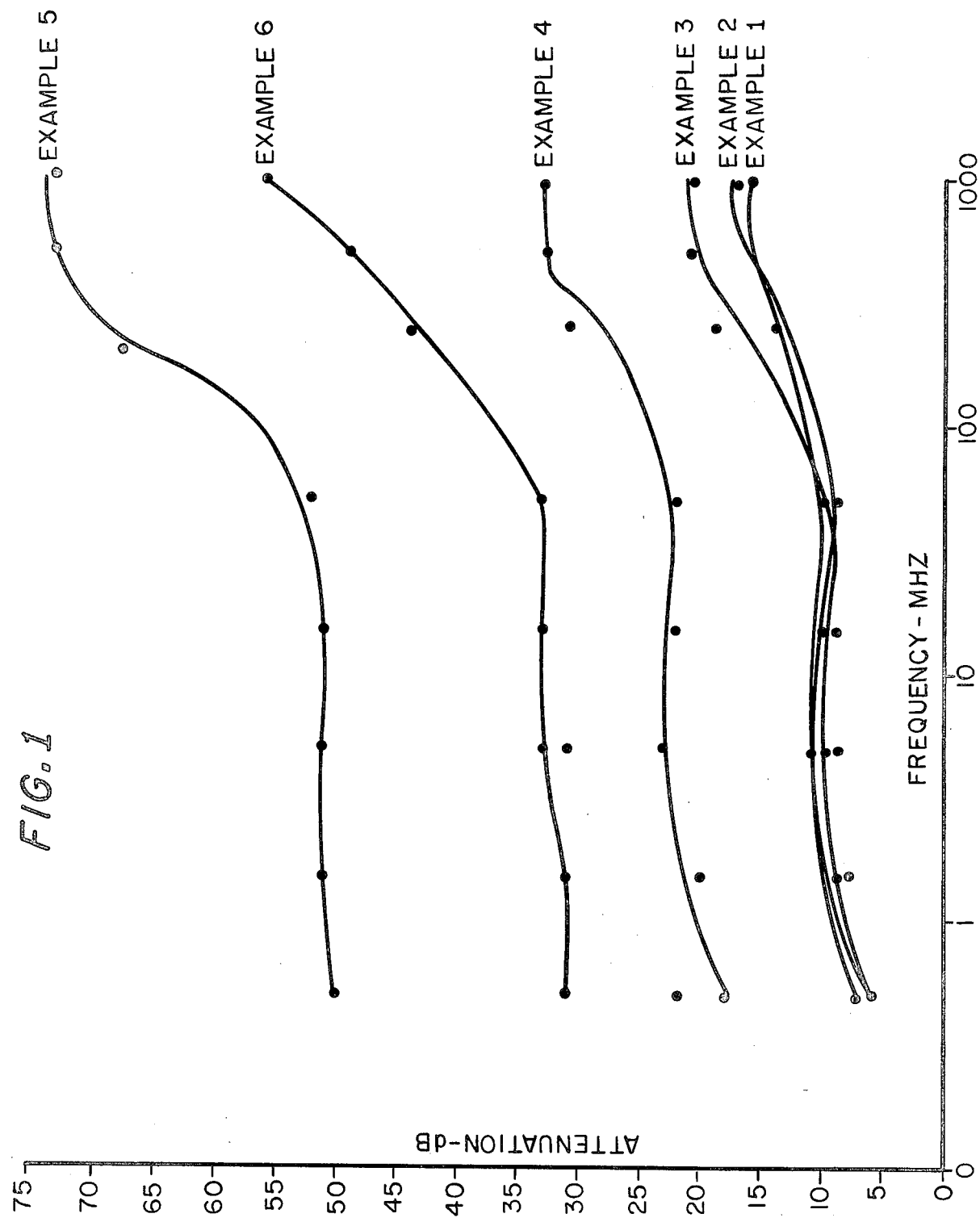
FIG. 1 shows curves of shielding efficiency versus frequency for Examples 1 to 6.

The present invention relates to molding compositions comprising a polymeric resin binder and a multi-component electroconductive filler system comprising at least two members selected from the group consisting of particles of carbon black, graphite and conductive metal(s). The components of the filler system are present in amounts sufficient to impart at least 20 dB of constant attenuation in EMI emissions over the frequency range of 0.5 to 1000 Mhz as measured by transmission line testing, said testing method being described hereinbelow. More specifically, the conductive filler system of the compositions of the immediate invention will consist of any combination of two or more of said components in a minimum amount sufficient to provide a total amount of filler surface area ranging from about $2 \times 10^{13}$ to about $2 \times 10^{14} \mu^2/cm^3$ of molded composition to provide shielding efficiencies of at least 20 dB, and more particularly, from about 30 to 90 dB, or more of attenuation to EMI emissions over frequencies of between 0.5 and 1000 Mhz. The total surface area of the conductive filler system, optimally, will be $3.0 \times 10^{13}$ to about $2.0 \times 10^{14} \mu^2/cm^3$ of molded composition.

The compositions may be suitably employed as bulk, granular or nodular molding compounds utilizing established methods of molding, including compression, transfer and injection techniques for fabricating composites in the form of shields, housings, and the like, for electronic equipment and components, power tools, ignition systems, appliances or for any component or equipment which emits EMI signals of sufficient strength to produce a malfunction. The compositions are especially useful in those instances where electromagnetic emissions have mixed frequencies. That is to say, because the composition of the present invention provides shielding coefficients of at least 20 dB, and more preferably, at least 30 dB of attenuation over the spectrum of frequencies between 0.5 and 1000 Mhz, the molding compositions herein are advantageous for fabricating composites used to shield electronic equipment which emits EMI signals at more than a single frequency.

The polymeric binder of the compositions is usually any suitable thermosetting type resin. Most appropriately, a phenolic type resin thermoset will serve as the binder, although thermoplastic type materials, both homo and copolymeric types such as polyolefins like polypropylene, polyethylene, and the like may be used with satisfactory results provided end use applications and required mechanical properties are taken into account. In addition to phenolic type resins, other thermosetting resins may be employed as binder materials, including epoxy type resins and polyesters. The polyesters belong to the class of unsaturated resinous compounds and include, for example, polyester laminating compounds, diallyl phthalate (DAP) and the polyester alkyd molding resins.

It will be understood that the term phenolic resins employed in the compositions herein are those phenol-aldehyde condensates which include heat-curable, one-stage phenolic resins and the heat fusible phenolic novolak type resins. The novolak type or two-stage resins are satisfactory for certain types of applications where corrosion of electrical components is not likely to occur from the formation of ammonia by-products. Otherwise, the single stage resole type phenolic resin is most preferred. The resole is prepared by reacting a phenol with an excess of an aldehyde, such as formaldehyde under alkaline conditions whereas the novolak type resin is produced by reacting a phenol with an aldehyde, usually formaldehyde in a molar ratio of approximately 1:0.8 in the presence of an acid catalyst. Compositions containing resoles may be cured to the thermoset conditions by the application of heat alone. The novolak based compounds can be made into thermosetting compounds by the addition of cross-linking compounds or methylene donors such as paraformaldehyde or hexamethylenetetramine.

The epoxy resins suitable as binders for the compositions of this invention include polymeric reaction products of polyfunctional halohydrins with polyhydric phenols. Such resins are known in the art as "epoxy", "epoxides", "glycidyl ethers", or "ether-epoxides". Among the polyfunctional halohydrins that may be used to make epoxy resins are epichlorohydrin, glycerol dichlorohydrin and the like. Typical polyhydric phenols are the resorcinols and the 2,2-bis(hydroxyphenyl) alkanes, i.e. compounds resulting from the condensation of phenols with aldehydes and ketones, including formaldehyde, acetaldehyde, propionaldehyde, acetone, etc. Epoxy resins may contain terminal epoxy and hydroxyl groups.

Many commercially available epoxy-type resins may be employed as suitable binders herein. They include, for example, the Epon resins available from Shell Chemical Corp., such as Epon 1001, Epon 1004, and Epon 1007, and the Araldite resins available from Ciba Products Company, such as Araldite 6071 and 7071. Also included within the scope of suitable resin binders are the novolak type epoxy resins which are similar to the more conventional bisphenol-A based epoxy resins. The novolak type epoxy resins have more rigidity and heat resistance because of higher functionality.

A wide range of thermosettable polyesters may also be used and include, for example granular resins, such as diallyl phthalates or DAP resins made from the reaction of allyl alcohol and phthalic anhydride to form DAP which is homopolymerized to form a free-flowing prepolymer which is thermoplastic. The prepolymer may be formed into a thermosettable molding resin by blending with a peroxide curing catalyst. A number of DAP type polyester molding resins are commercially available under the trademark DAPON resin #35, 300-340 CP from FMC, and DAISO-A from Nickimen Chemical, Japan.

Alkyd molding resins, sometimes referred to as "polyester alkyds" may also be employed as resin binders. They comprise an unsaturated acid of the maleic or fumaric type and phthalic acid isomers reacted with a polyol, preferably a glycol, such as ethylene, propylene, 1,4-butane diol, etc. These resins also include the crystallizable polyesters. The alkyd type molding compounds are commercially available under such trademarks as Pioester 1285F and 12685F from Pioneer Chemical Company.

Other suitable resin binders for use in the compositions of the subject invention are generally known as "bulk", "gunk" or "laminate" type materials. That is to say, resin binders which are not in the nodular or granular form may also be employed with equally satisfactory results. They include, for example, the polyester laminating resins which are viscous, generally pale yellow colored materials produced by condensing a polyol with both unsaturated and saturated dicarboxylic acids. In practice, the polyester resin is mixed with a reactive unsaturated monomer diluent, such as styrene. Crosslinking occurs via an addition mechanism across the double bonds in the polyester and reactive diluent.

The conductive filler system is multi-component containing at least two members selected from particulate carbon black, graphite particles and metals, such as steel, aluminum, copper, zinc, nickel, lead, silver, gold and mixtures thereof. In addition to said metals, those materials falling within the class of refractory ferroalloys known for their electrical conductivity may be used, including such compounds as ferrophosphorous (FeP), ferromanganese and ferrosilicon. Thus, the conductive filler system may include various combinations, such as carbon black and graphite or particulate aluminum and carbon black, as well as lead, aluminum, graphite, carbon black and ferrophosphorous particles, etc.

The combination of conductive fillers will impart optimum attenuation to EMI emissions for a given application, such that the total volume loading provides shielding efficiency (dB)/frequency response curve that is also substantially linear over the entire frequency spectrum of 0.5 to 1000 Mhz. That is to say, shielding efficiencies measured at any given frequency within said range will always remain at at least 20 dB of attenuation, and more preferably, at least 30 dB attenuation. However, because high loading of fillers like carbon black, graphite and also particulate metals can destroy the mechanical properties of a molded article, the combination of fillers enables use of lesser quantities of each filler to obtain maximum shielding with minimal penalty in mechanical and processing characteristics. Thus, the objective is to have the highest and most continuous shielding efficiency or effectiveness at the lowest conductive filler loading for a given application.

It was discovered actual performance of the multi-component conductive filler system is not only dependent on the inherent conductivity of the individual filler component, but also the summation of surface area provided by all the particles. In other words, a factor controlling the degree of EMI shielding is the shape or geometry of the filler particles, as well as the size and density of said particles. Thus, the compositions of the immediate invention will contain the minimal amount of conductive filler needed to provide a total conductive filler surface area in the range of about $2.0 \times 10^{13}$ to about $2 \times 10^{14}$ $\mu^2/cm^3$ of molded composition to obtain a shielding of at least 20 dB, and more preferably, at least 30 dB of attenuation in EMI emissions over a frequency range of 0.5 to 1000 Mhz as measured by transmission line testing.

In order to achieve maximum shielding effectiveness to electromagnetic emissions, that is to say, the ratio of incident EMI signal strength to the signal strength of EMI not shielded, the conductive filler particles dispersed throughout the resin matrix should be in intimate contact, so that a low resistance electrical path is available. To best achieve this result, the conductive filler particles, for example, in the case of carbon blacks would most advantageously consist of small nodule sizes. As such, small nodule or primary particle size carbon blacks have more aggregates in contact and are separated by smaller distances thereby providing greater conductivity. For that reason, furnace blacks and acetylene blacks are more preferred for use in the disclosed compositions than, for example, channel blacks and thermal blacks. Because of greater conductivity, fine particle size carbon black powders are generally more desirable. However, carbon black fibers may also be employed for added strength and reinforcement.

Graphite, like that of carbon black, is available in different particle sizes. Any of the commercially available grades may be used, including powders, flakes, crystals, fibers, etc. Although graphite fibers do effectively enhance the mechanical properties of molded composites, granular or powdered grades are preferred in most instances because of greater surface areas.

Conductive metal particles include the group cited hereinabove, and preferably, any of aluminum, copper, zinc or steel. Particulate aluminum metal, for example, is most preferred and may be used in the form of powders, filings, drillings, flakes, fibers and ribbon. Aluminum flakes and fibers are available from Transmet Corp., Columbus, Ohio, under the designation K-102 and B-103 through B-106.

Although the basis of conductive filler loadings for purposes of the present invention is the total surface area provided by the conductive filler system per volume of molded composite, rather than in terms of weight measure, generally however, the molding compositions will contain a minimum of about 3 to 4 to a maximum of 8 to 12 weight percent carbon black and graphite. Particulate metals will be generally present in an amount from 15 to 18 weight percent to a maximum of 30 to 35 weight percent.

The compositions disclosed herein may be readily made in molding compounds by the addition of various non-conductive functional additives. Typically, these additives will include various inert fillers, reinforcing agents, modifiers and processing aids such as lubricants, etc., conventionally employed in thermosetting plastics. Fillers, extenders and reinforcing agents facilitate the molding process and control the mechanical and strength properties of the molded article. They may belong to both the organic and mineral classes of fillers, and include, for example, ground flours like wood and walnut shell flours, cotton flock, chopped paper, mica, glass fiber, diatomacious silica, and the like. Because of the tendency of molding compounds to adhere to the walls of equipment, lubricants such as zinc stearate may also be employed. Other suitable lubricants are, for example, the amides, polyethyleneoxides, and the fluorinated fatty acid esters.

Compounding of the resin, conductive and non-conductive fillers and additives to a bulk, granular or nodular molding compound according to the present invention requires standard methods and equipment, both of which are well established in the art. For example, blending the components from ambient room temperature to about 60° C. may be performed using a jacketed twin-sigma blade mixer. Each component of the composition is added separately to the mixer varying the order of addition except for glass-type fillers and silane coupling agents. These are best added first to the mixer to insure good wet out of the coupling agent to the glass. Multiple 2 to 5 minute mixing cycles between the addition of each component to the mixer is suggested to insure uniform and adequate wet out. Extra mixing time should be allowed after the addition of the final component. The compounded BMC composite formulation is then dumped, spread and allowed to cool or air-harden until non-tacky. The prepared composite will range from a coarse, granular material to a soft, slightly tacky material with a dull-like consistency.

The following specific examples and their reference to the attached drawings demonstrate the subject invention. However, it is to be understood that these examples are for illustrative purposes only, and do not purport to be wholly definitive as to conditions and scope.

EXAMPLE 1

A molding compound comprising a resin binder and an all conductive and mineral filler was prepared in a jacketed sigma blade, two-gallon capacity mixer, preheated to 60°–70° C. Twenty g. of amino silane coupling agent was slowly added over several minutes to 875 g. of OCF ⅛-inch chopped glass filler. The two materials were then allowed to mix for two minutes. At the end of said mixing cycle, 1120 g. of Durez phenol-formaldehyde one-stage #31065 resin was added to the mixer and mixing continued for an additional two-minute interval. 140 g. of furnace black, a powdered grade carbon black available under the trademark Black Pearls-800 from Cabot Corp.; 140 g. of APS powdered graphite available from Asbury Graphite Mills, Inc.; 140 g. of particulate ferrophosphorous available from Hooker Chemicals & Plastics Corp., under the trademark Ferrophos; and 350 g. of aluminum flake under the designation K-102 from Transmet Corp., Columbus, Ohio, were added in the above order with two-minute intervals of mixing between each material. Subsequently, 675 g. of a premix consisting of Wollastonite, amino silane and fumed silica in a 4:1:1 weight ratio was added to the mixer and mixing was continued for an additional five minute period. Twenty-five grams of lime (CaO) was then added and mixed for three minutes. Lastly, 15 g. of zinc stearate lubricant was added and mixed for an additional five minutes.

The composite mixture was dumped from the mixer. The mixture which was in the form of small chunks and pieces was allowed to cool at room temperature overnight. By the following day, the material had hardened and was then ground through a hammer mill using a ⅜-inch screen.

EXAMPLES 2-6

Five additional molding compounds were prepared following much the same procedure of that used in Example 1. The specific formulations in percent-by-weight are shown in Table I below where certain raw materials were omitted and added in each formulation, i.e. . . . an electrically conductive grade of carbon black available from Armack Company, Burt, N.Y. available under the trademark Ketjin Black having particle sizes in the range of 30 u was used in Examples 5 and 6 in place of Cabot's Black Pearls-800 carbon black used in Examples 1–4. With the exception of the initial charge of amino silane to the glass filler followed by the addition of resin and finally lime and lubricant, the actual order of addition of the conductive fillers varied slightly in Examples 2-6.

TABLE I

| Materials | Examples | | | | | |
|---|---|---|---|---|---|---|
| (Weight %) | 1 | 2 | 3 | 4 | 5 | 6 |
| Glass Filler | 25.0 | 25.0 | 25.0 | 25.0 | 25.3 | 26.4 |
| Amino Silane | 0.6 | 0.6 | 0.6 | 0.6 | 0.6 | 0.6 |
| Black Pearls-800 TM | 4.0 | 4.0 | 4.0 | 8.0 | — | — |
| Ketjin Black TM | — | — | — | — | 8.1 | 4.2 |
| APS Graphite | 4.0 | 4.0 | 4.0 | 8.0 | 8.1 | 4.2 |
| Ferrophos ® | 4.0 | 4.0 | 4.0 | 4.0 | 4.1 | 8.4 |
| Aluminum Flake | 10.0 | 13.6 | 20.0 | 21.3 | 20.3 | 21.1 |
| Lime | 0.7 | 0.7 | 0.7 | 0.7 | 0.7 | 0.8 |
| Zinc Stearate | 0.4 | 0.4 | 0.4 | 0.4 | 0.4 | 0.5 |
| Premix | 19.3 | 15.7 | 9.3 | — | — | — |
| Phenolic Resin | 32.0 | 32.0 | 32.0 | 32.0 | 32.4 | 33.8 |
| | 100.0 | 100.0 | 100.0 | 100.0 | 100.0 | 100.0 |

TABLE II

| Example | Total Surface Area - Conductive Filler ($\mu^2/cm^3$ molded composition) |
|---|---|
| 1 | $1.641 \times 10^{13}$ |
| 2 | $1.642 \times 10^{13}$ |
| 3 | $1.601 \times 10^{13}$ |
| 4 | $3.118 \times 10^{13}$ |
| 5 | $1.502 \times 10^{14}$ |
| 6 | $7.082 \times 10^{13}$ |

Following ASTM D-796 procedures for phenolic resin compounds test pieces were made by compression molding using the composition of Examples 1–6. The mechanical properties of the test pieces where then determined by ASTM procedures. The results and procedures are provided in Table III below.

TABLE III

| Property | Units | Examples | | | | | |
|---|---|---|---|---|---|---|---|
| | | 1 | 2 | 3 | 4 | 5 | 6 |
| Flexural Strength | $\times 10^{13}$ psi | 13.8 | 12.4 | 11.1 | 12.0 | 8.3 | 11.4 |
| Flexural Modulus (ASTM-D-796) | $\times 10^6$ psi | 3.9 | 4.9 | 3.4 | 4.6 | 3.3 | 3.7 |
| Tensile Strength | $\times 10^{13}$ psi | 8.8 | 8.3 | 7.8 | 7.0 | 5.2 | 5.9 |
| Tensile Modulus | $\times 10^6$ psi | 2.6 | 2.4 | 2.4 | 2.6 | 2.4 | 2.6 |

TABLE III-continued

| Property | Units | Examples | | | | | |
|---|---|---|---|---|---|---|---|
| | | 1 | 2 | 3 | 4 | 5 | 6 |
| (ASTM-D-638) | | | | | | | |
| Izod Impact (ASTM-D-256) | ft. lbs./in. notch | 0.92 | 0.76 | 0.70 | 0.67 | 0.66 | 0.74 |
| Heat distribution @ 264 psi (ASTM-D-648) | °F. | 552 | 550 | 525 | 541 | 541 | 540 |
| Molded shrinkage (ASTM-D-955) | in/in | 0.0001 | 0.0001 | 0.0003 | 0.0007 | 0.0008 | 0.0007 |

Additional compound from Examples 1-6 was used to prepare ASTM compression-molded 4-inch diameter by ⅛-inch thick electrical shaped discs. The centers of the discs were punched out for testing to determine the intrinsic properties of the composite materials for shielding potential. Coaxial transmission line method of measuring shielding efficiency was used.

TRANSMISSION LINE TESTING

The shielding effectiveness (SE) of a material may be expressed as:

$$SE = 10 \log P_1/P_2 \, dB$$

where $P_1$ is incident power and $P_2$ is transmitted power. SE can be separated into its components by the expression:

$$SE = R + A + B$$

where R is the reflected portion in dB, A is the absorbed portion in dB, B is the internal multiple reflection portion in dB.

Figure 3:
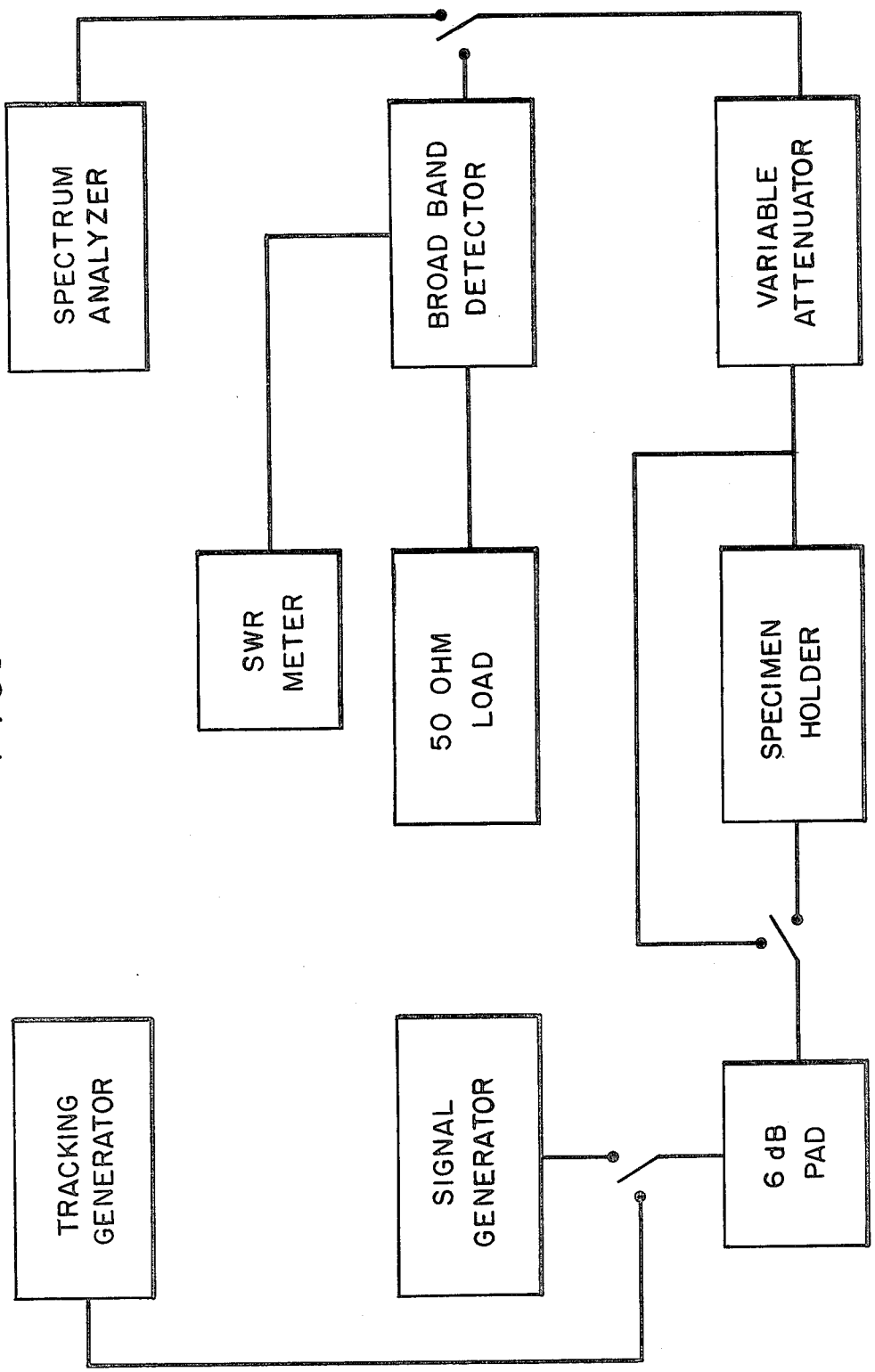
FIG. 3 is a block diagram of a technique for coaxial transmission line measurement.

Coaxial transmission line measurement is shown as a block diagram in FIG. 3 which basically illustrates an insertion loss measurement technique using a substitution method (see Coaxial and Waveguide Catalog and Measurement Handbook, Hewlett Packard, 1979-1980). Measurement (SE) can be made using either point-by-point mode or swept-frequency mode. Using the point-by-point mode at specific frequencies can be conducted using the tracking generator and spectrum analyzer as a receiver. The point-by-point mode allows other data to be taken at each frequency, if desired, such as reflection coefficient. The swept-frequency mode has the advantage of a full spectrum presentation at one time.

If the point-by-point mode is used, the system is first set up at a given frequency with no specimen holder, that is in by-pass position. The variable attenuator is set up with maximum attenuation for the initial setting. The signal level on the meter is noted. The specimen holder is then entered into the system and the attenuator reduced until the same reading is obtained on the amplifier as initially observed. The attenuation in dB removed from the attenuator is the shielding effectiveness of the material in the specimen holder. Measurement is made from 0.5 to 1000 Mhz.

The swept-frequency mode can be used satisfactorily with the transmission line method due to its broad band width. The signal generator is replaced with the tracking generator driven by a spectrum analyzer. The spectrum analyzer presents the response of the system over the whole band width of the analyzer in one curve on the display screen. Two responses are necessary—one without the specimen in the holder and one with the specimen. The SE of the specimen is the difference of the curves obtained manually or recorded or subtracted by computing the system.

Further information concerning the method and apparatus used in coaxial transmission line testing for measuring shielding effectiveness, including structural details for the specimen holder are fully disclosed in U.S. Pat. No. 4,281,284 issued July 28, 1981 to David E. Stutz et al., said patent being incorporated-by-reference herein.

The compositions of Examples 1-3 each contain four (4) conductive fillers: carbon black, graphite, ferrophosphorous and aluminum flake. The physical properties of said compositions (1-3) were at a satisfactory high level (Table III). However, the shielding effectiveness of said compositions was well below the 20 dB of attenuation over virtually the entire frequency range of 0.5 to 1000 Mhz. as shown in FIG. 1 of the drawings. In each instance, the total surface area of the conductive filler was below the minimum $2 \times 10^{13}$ $\mu^2/cm^3$ of molded composition (Table II). By comparision, Examples 4-6 also having conductive fillers comprising carbon black, graphite, ferrophosphorous and aluminum flake had total surface areas of between $3.1 \times 10^{13}$ to $2.0 \times 10^{14}$ $\mu^2/cm^3$ of molded composite and shielding efficiencies of at least 20 dB over most of the frequencies between 0.5 and 1000 Mhz. This illustrates the close correlation between total surface area requirements of conductive filler and the degree of shielding effectiveness. The flexure and tensile strengths (Table III) for Examples 4-6 did degrade slightly as conductive filler composition and loading were increased, but these physical properties were still within the acceptable range for most molding applications. Impact properties did degrade on increase in total surface area of conductive filler, but leveled off in those instances where the composition had shielding efficiencies in excess of 30 dB. HDT (heat distribution) showed no real change over all levels of conductive filler loadings.

EXAMPLES 7-13

To illustrate that high shielding efficiencies to EMI emissions are attainable with other combinations of conductive and inert fillers, compounds were prepared with formulations shown in Table IV below, molded and tested. The method of preparation for the molding compounds of Examples 7-13 correspond to Example 1. Grinding and ASTM molding also followed the same procedure of Example 1.

TABLE IV

| Materials (Weight %) | Examples | | | | | | |
|---|---|---|---|---|---|---|---|
| | 7 | 8 | 9 | 10 | 11 | 12 | 13 |
| Glass Filler | 25.00 | 25.00 | 22.55 | 22.55 | 22.55 | 22.55 | 20.64 |
| Amino Silane | 0.26 | 0.26 | 0.23 | 0.23 | 0.23 | 0.23 | 0.21 |
| Ketjin Black | 8.00 | — | — | — | 7.22 | 7.22 | 6.61 |
| APS Graphite | — | 8.00 | — | — | 7.22 | 7.22 | 6.61 |
| Ferrophosphorous | — | — | 7.22 | — | — | 7.22 | 6.61 |
| Aluminum Flake | — | — | — | 22.55 | — | — | 20.64 |
| Lime | 3.00 | 3.00 | 2.71 | 2.71 | 2.71 | 2.71 | 2.56 |
| Zinc Stearate | 1.00 | 1.00 | 0.90 | 0.90 | 0.90 | 0.90 | 0.83 |
| Premix | 30.74 | — | — | — | — | — | — |
| Wood Flour | — | 30.74 | 27.73 | 12.40 | 20.51 | 13.29 | — |
| Phenolic resin (Durez 31289) | 32.00 | 32.00 | 38.66 | 38.66 | 38.66 | 38.66 | 35.39 |
| | 100.00 | 100.00 | 100.00 | 100.00 | 100.00 | 100.00 | 100.00 |

TABLE V

| Example | Total Surface Area - Conductive Filler ($\mu^2/cm^3$ molded composition) |
|---|---|
| 7 | $1.56 \times 10^{14}$ |
| 8 | $1.640 \times 10^{10}$ |
| 9 | $4.80 \times 10^9$ |
| 10 | $9.508 \times 10^9$ |
| 11 | $8.831 \times 10^{13}$ |
| 12 | $9.751 \times 10^{13}$ |
| 13 | $1.209 \times 10^{14}$ |

Figure 2:
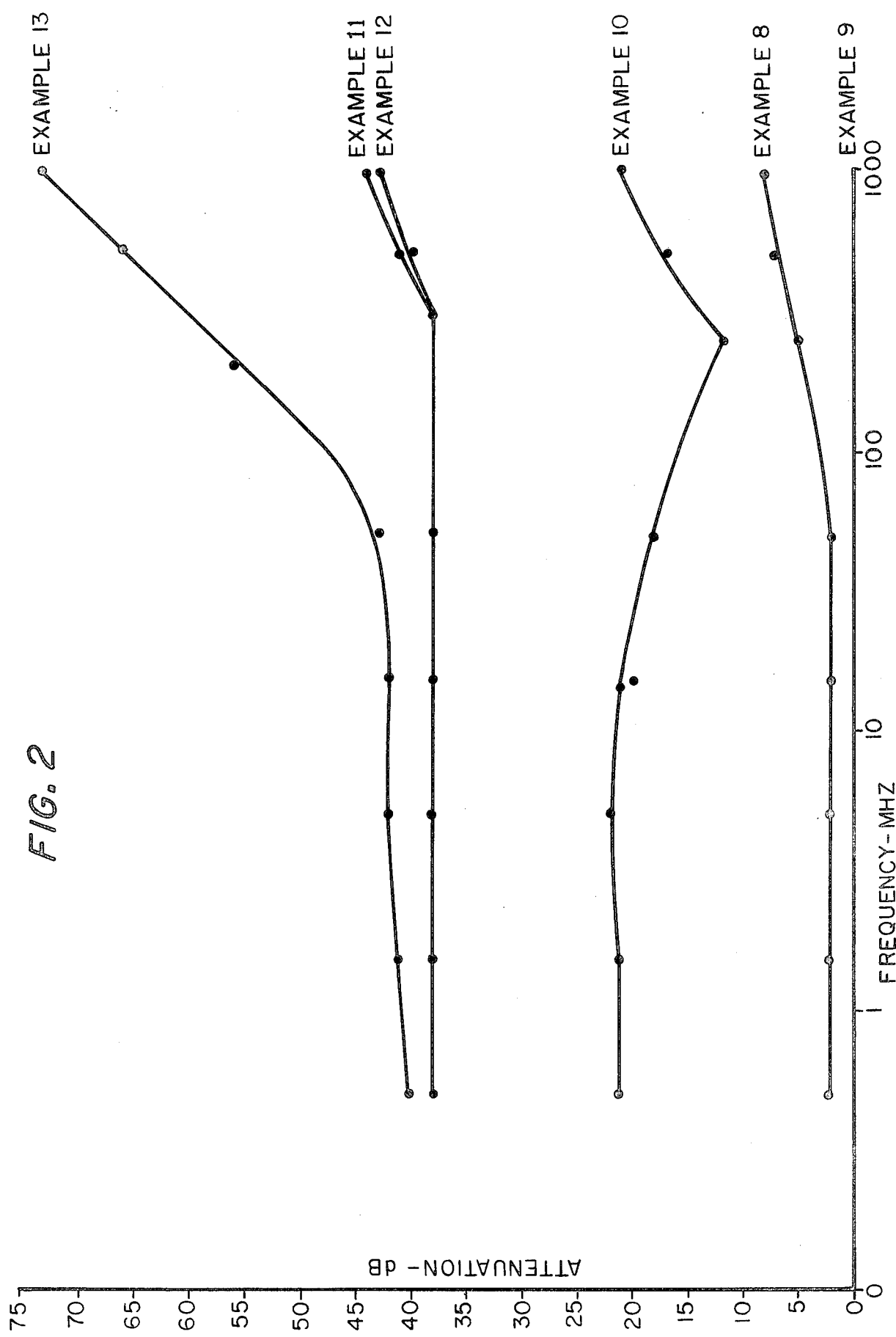
FIG. 2 shows curves of shielding efficiency versus frequency for Example 8 to 13.

Compression molded electrical discs 4-inch in diameter by ⅛-inch thick were prepared and tested for shielding potential using the transmission line testing technique previously described. The results of that testing are shown in FIG. 2 of the drawing.

The testing disc made from the composite of Examples 7 broke and no readings were taken. Examples 8, 9 and 10, having a conductive filler of graphite, ferrophosphorous and aluminum flake, respectively, had low total surface areas (see Table V), i.e. total surface area of conductive filler below $2 \times 10^{13}$ $\mu^2/cm^3$, and correspondingly, provided shielding efficiencies which were below 20 dB attentuation over the frequency range of 0.5 to 1000 Mhz. Example 10 did provide shielding efficiencies of 21–22 dB, but performance fell after 10 Mhz. When two or more conductive fillers were used to provide a total surface area of at least $2 \times 10^{13}$ $\mu^2/cm^3$ of molded composite, the shielding effectiveness, e.g. Examples 11, 12 and 13, were well above 30 dB level of attenuation with a substantially linear curve over the frequency spectrum of 0.5 to 1000 Mhz.

Wnile the invention has been described in conjunction with the specific examples thereof, this is illustrative only. Accordingly, many alternatives, modifications and variations will be apparent to those skilled in the art in light of the foregoing description, and it is therefore intended to embrace all such alternatives, modifications and variations as to fall within the spirit and broad scope of the appended claims.

What is claimed is:

1. A molding composition comprising a thermosetting resin binder and an electrically-conductive filler comprising particles of carbon black, graphite and a conductive metal, said conductive filler being present in a minimum amount sufficient to provide (a) a total conductive filler surface area of about $2 \times 10^{13}$ to about $2 \times 10^{14}$ $\mu^2/cm^3$ of molded composition, and (b) a shielding effectiveness of at least 20 dB of attenuation in EMI emissions over a frequency range of 0.5 to 1000 Mhz. as measured by transmission line testing, wherein the binder is selected from the group consisting of phenolic resins, epoxy resins and unsaturated polyester resins, and wherein the conductive metal particles are selected from the group consisting of steel, aluminum, copper, zinc, nickel, lead, silver, gold and mixtures thereof.

2. The composition of claim 2 having a shielding effectiveness of at least 30 dB of attenuation in EMI emissions over the frequency range of 0.5 to 1000 Mhz.

3. The composition of claim 2 wherein the binder is a phenolic resin.

4. The composition of claim 3 wherein the phenolic resin is a one-stage phenol-aldehyde resin.

5. The composition of claim 3 wherein the phenolic resin is a thermosettable two-stage phenol-aldehyde resin.

6. The composition of claim 2 wherein the conductive metal particles are flaked or fibrous aluminum.

7. The composition of claim 1 including inert fillers.

8. The composition of claim 7 including a particulate refractory ferroalloy.

9. The composition of claim 8 wherein the ferroalloy is ferrophosphorous.

10. An electrically conductive molding compound having an EMI shielding effectiveness of at least 20 dB of attenuation over a frequency range of 0.5 to 1000 Mhz. as measured by transmission line testing, said compound comprising a thermosettable resin binder and an electrically conductive filler comprising particles of carbon black, graphite and a conductive metal wherein the filler is present in a minimum amount sufficient to provide a total conductive filler surface area of about $2 \times 10^{13}$ to about $2 \times 10^{14}$ $\mu^2/cm^3$ of molded compound, wherein the binder is selected from the group consisting of phenolic resins, epoxy resins and unsaturated polyester resins, and wherein the conductive metal particles are selected from the group consisting of steel, aluminum, copper, zinc, nickel, lead, silver, gold and mixtures thereof.

11. The molding compound of claim 10 having a shielding effectiveness of at least 30 dB of attenuation to EMI emissions over a frequency range of 0.5 to 1000 Mhz.

12. The molding compound of claim 11 wherein the binder is a phenolic resin.

13. The molding compound of claim 12 wherein the phenolic resin is a one-stage phenol-aldehyde resin.

14. The molding compound of claim 12 wherein the phenolic resin is a thermosettable two-stage phenol-aldehyde resin.

15. The molding compound of claim 12 including ferrophosphorous.

16. The molding compound of claim 10 including inert filler.

17. A molded composite made from the compound of claim 10.

18. A molded composite made from a compound of claim 11.

19. A molded composite made from a compound of claim 12.

20. A molded composite made from the compound of claim 16.

21. A molding composition comprising a thermosettable resin binder and a conductive filler system comprising particles of carbon black, graphite and a conductive metal, said conductive fillers being present in minimum amounts sufficient to import to the composition at least 20 dB of constant attenuation to EMI emissions over a frequency range of 0.5 to 1000 Mhz. as measured by transmission line testing and without substantial reduction in mechanical properties, wherein the binder is selected from the group consisting of phenolic resins, epozy resins and unsaturated polyester resins, and wherein the conductive metal particles are selected from the group consisting of steel, aluminum, copper, zinc, nickel, lead, silver, gold and mixtures thereof.

22. The composition of claim 21 wherein the thermosettable resin binder is a phenolic resin and the conductive filler comprises carbon black, graphite and at least one particulate metal selected from aluminum, copper, zinc or lead, said fillers being present in minimum amounts sufficient to impart from about 30 to 70 dB of constant attenuation in EMI emission over frequencies between 0.5 to 1000 Mhz. as measured by transmission line testing.

23. The composition of claim 23 including ferrophosphorous.

* * * * *